United States Patent
Anemikos et al.

(10) Patent No.: US 7,521,973 B1
(45) Date of Patent: Apr. 21, 2009

(54) CLOCK-SKEW TUNING APPARATUS AND METHOD

(75) Inventors: Theodoros E Anemikos, Milton, VT (US); Michael Richard Quellette, Westford, VT (US); Anthony D Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/140,482

(22) Filed: Jun. 17, 2008

(51) Int. Cl.
*H03L 7/00* (2006.01)

(52) U.S. Cl. ............... 327/144; 327/21; 327/51; 327/145; 365/233.11; 365/233.5

(58) Field of Classification Search ............... None
See application file for complete search history.

(56) References Cited

U.S. PATENT DOCUMENTS

| | | | |
|---|---|---|---|
| 5,485,430 A * | 1/1996 | McClure .................... | 327/51 |
| 5,670,903 A | 9/1997 | Mizuno | |
| 6,271,696 B1 | 8/2001 | Kobayashi | |
| 6,323,714 B1 * | 11/2001 | Naffziger et al. ............ | 327/295 |
| 6,653,877 B2 | 11/2003 | Tsujino | |
| 6,791,370 B1 | 9/2004 | Morzano | |
| 6,847,582 B2 * | 1/2005 | Pan ........................ | 327/295 |
| 6,903,582 B2 | 6/2005 | Gaskins et al. | |
| 7,102,406 B2 | 9/2006 | Ishihara | |
| 7,124,314 B2 | 10/2006 | Hariharan et al. | |
| 7,236,035 B2 | 6/2007 | Shiratake et al. | |
| 7,277,808 B1 | 10/2007 | Damodaran et al. | |
| 7,310,011 B2 * | 12/2007 | Kanari .................... | 327/295 |

OTHER PUBLICATIONS

Attarha, Amir; Nourani, Mehrdad; (Ctr. for Integrated Circuits/Systems, University of Texas at Dallas), Testing Interconnects for Noise and Skew in Gigahertz SoCs, IEEE International Test Conference (TC), 2001, Baltimore, MD, p. 305-314, Publisher: Institute of Electrical and Electronics Engineers Inc.

* cited by examiner

*Primary Examiner*—Long Nguyen
(74) *Attorney, Agent, or Firm*—Nelson and Nelson; Daniel P. Nelson; Alexis V. Nelson

(57) ABSTRACT

A method for detecting which of two clock signals is the first to arrive may include providing a sense amplifier comprising first and second nodes located on first and second legs thereof. The sense amplifier is configured such that the first and second nodes have a substantially equivalent initial voltage. The method then includes receiving first and second clock signals. The sense amplifier is configured such that the voltage of the first node increases and the voltage of the second node decreases if the first clock signal arrives before the second clock signal. Similarly, the sense amplifier is configured such that the voltage of the second node increases and the voltage of the first node decreases if the second clock signal arrives before the first clock signal. The method may further include sampling the voltage of at least one of the first and second nodes to determine which of the first and second clock signals was the first to arrive.

1 Claim, 5 Drawing Sheets

CLOCK-SKEW TUNING APPARATUS AND METHOD

BACKGROUND

1. Field of the Invention

This invention relates to circuit timing, and more particularly to apparatus and methods to reduce clock and timing skew in integrated circuits.

2. Background of the Invention

As clock speeds continue to increase and cross-die variations becomes harder and harder to control, the ability to align the arrival times of signals that traverse different paths is becoming increasingly challenging. One example is that of minimizing or reducing the skew between two different branches of a clock tree. However, there are many other cases where divergent signals also need to be aligned.

Traditional approaches to align signals are typically design based. For example, clock distribution networks may be designed in the form of H-Trees to ensure that clock branches are symmetric. That is, each level of the clock tree may be designed to have similar gates with similar loading to ensure that propagation delays are as identical as possible through each level of the tree.

Despite these efforts, process variations and other factors may still add significant skew to even perfectly designed H-trees. Such variations may occur in both the gates and wiring network of the circuit. While there are many known sources of variation (e.g., mask/reticle, design, neighborhood effects, wafer location, etc.), there are currently no methods that can accurately predict and correct for these effects. The relatively new field of statistical timing acknowledges a distribution of arrival times for each signal but does nothing to improve the distributions. Although circuits may be designed to account for larger delay distributions, this may significantly degrade the circuits' performance.

In view of the foregoing, what is needed is an apparatus and method to correct timing skew or clock skew in integrated circuits. Ideally, such an apparatus and method would be able to measure timing skew or clock skew with a high degree of precision so that very high-resolution adjustments can be made. Further needed are apparatus and methods to test and programmably correct timing and clock skew in integrated circuits.

SUMMARY

The invention has been developed in response to the present state of the art and, in particular, in response to the problems and needs in the art that have not yet been fully solved by currently available apparatus and methods. Accordingly, the invention has been developed to provide improved apparatus and methods to correct timing and clock skew in integrated circuits. The features and advantages of the invention will become more fully apparent from the following description and appended claims, or may be learned by practice of the invention as set forth hereinafter.

Consistent with the foregoing, a method for detecting which of two clock signals is the first to arrive is disclosed herein. In selected embodiments, such a method may include providing a sense amplifier comprising first and second nodes located on first and second legs thereof. The sense amplifier is configured such that the first and second nodes have a substantially equivalent initial voltage. The initial voltage may be between a power supply voltage and a ground voltage. The method then includes receiving first and second clock signals. The sense amplifier is configured such that the voltage of the first node increases and the voltage of the second node decreases if the first clock signal arrives before the second clock signal. Similarly, the sense amplifier is configured such that the voltage of the second node increases and the voltage of the first node decreases if the second clock signal arrives before the first clock signal. The method may further include sampling the voltage of at least one of the first and second nodes to determine which of the first and second clock signals was the first to arrive.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
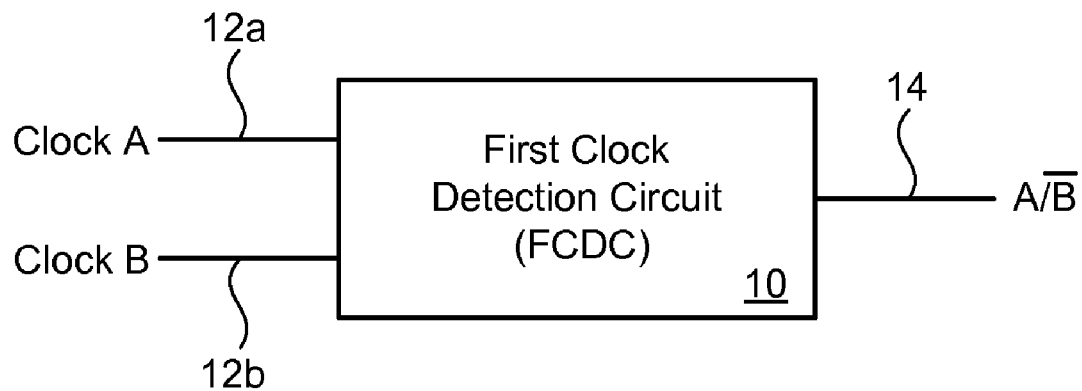
FIG. 1 is a high-level block diagram of one embodiment of a first clock detection circuit in accordance with the invention.
Figure 2:
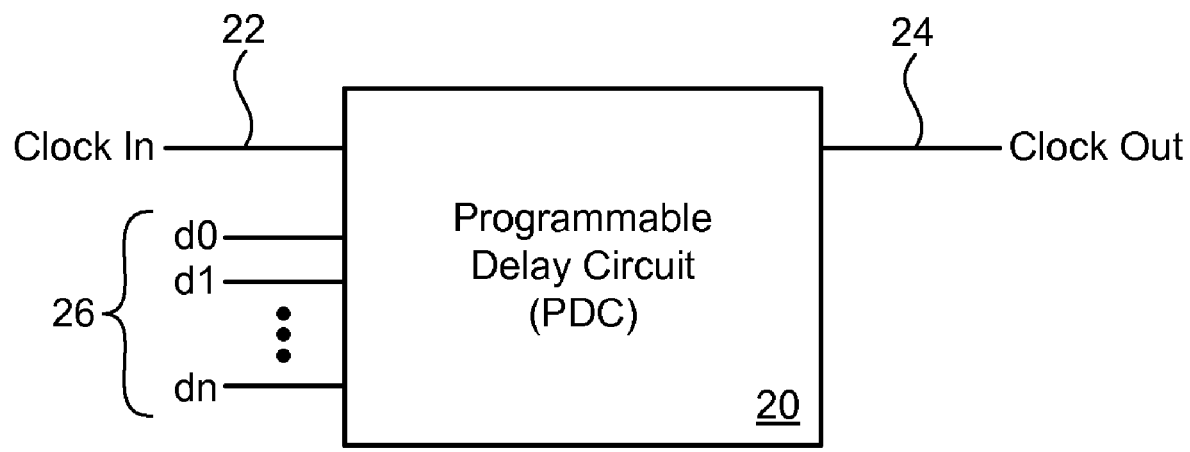
FIG. 2 is a high-level block diagram of one embodiment of a programmable delay circuit in accordance with the invention.
Figure 2:
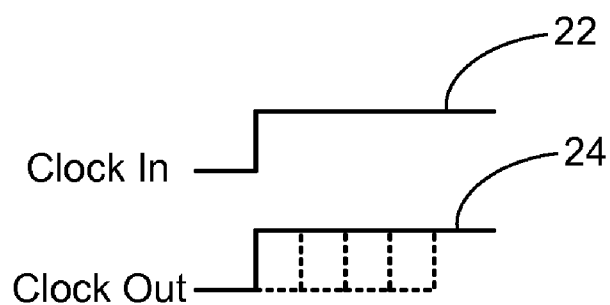

Referring to FIGS. 1 and 2, in order to reduce a circuit's timing skew or clock skew, various components may be provided. FIG. 1 shows one embodiment of a first clock detection circuit 10. In selected embodiments, this circuit 10 may receive multiple signals (e.g., a pair of signals 12a, 12b) and generate an output 14 that indicates which signal 12a, 12b was the first to arrive at the first clock detection circuit 10. For example, if a first clock signal 12a arrives first, the first clock detection circuit 10 may output a logical "1." Similarly, if a second clock signal 12b arrives first, the first clock detection circuit 10 may output a logical "0." As will be shown in more detail hereafter, the first clock detection circuit 10 may provide an important building block to tune the timing or clock skew of a circuit.

FIG. 2 shows one embodiment of a programmable delay circuit 20. In selected embodiments, this circuit 20 may receive a signal 22 and output the same signal 24 delayed by some duration. In certain embodiments, a pattern 26 of bits may designate the duration of the delay. Thus, the delay of the programmable delay circuit 20 may be changed by simply changing the bit pattern 26.

Figure 3:
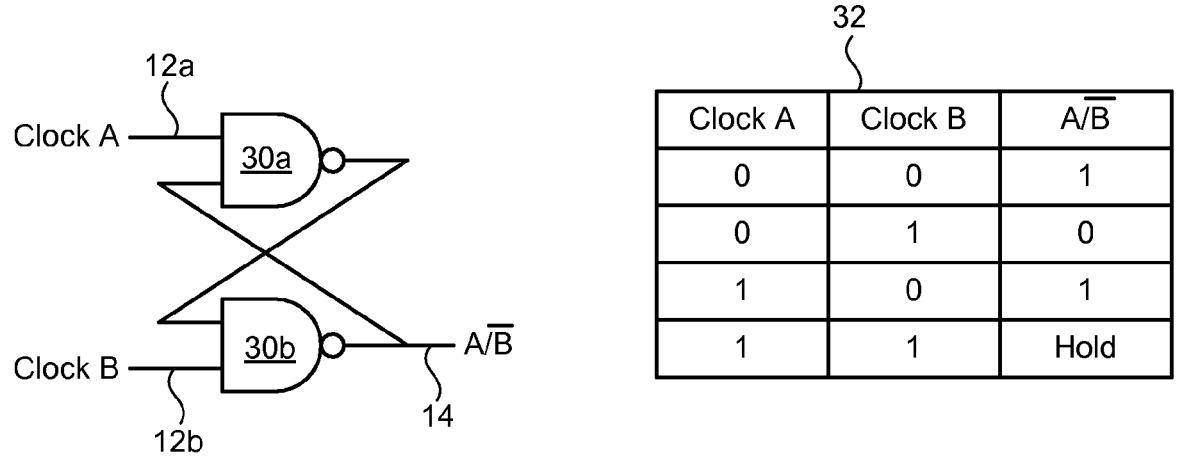
FIG. 3 is a block diagram of one embodiment of a pair of cross-coupled NAND gates used to detect which of two clock signals is the first to arrive, and a truth table associated with the cross-coupled NAND gates.

Referring to FIG. 3, in selected embodiments, a first clock detection circuit 10 in accordance with the invention may provide roughly the same functionality as a pair of cross-coupled NAND gates 30a, 30b, although a first clock detection circuit 10 may differ in some important ways as will be discussed in association with FIG. 5. As shown, the cross-coupled NAND gates 30a, 30b may receive a pair of clock signals 12a, 12b and generate an output 14 that designates which clock signal 12a, 12b arrived first. A truth table 32 is provided to show the values of the inputs and outputs.

Figure 4:
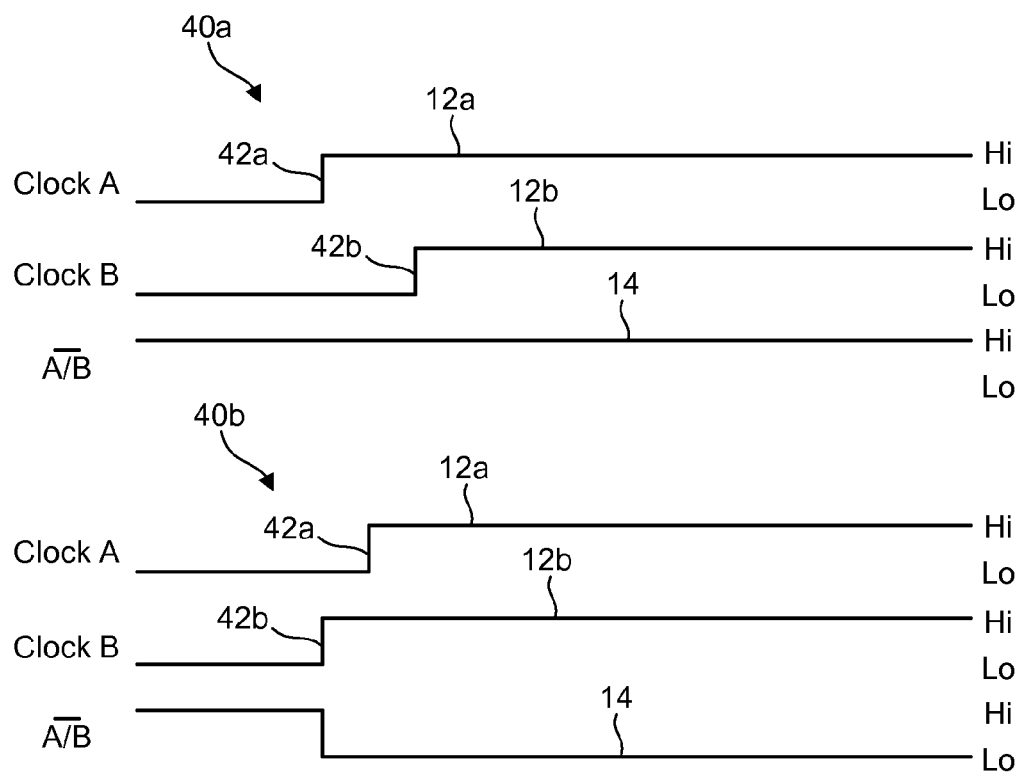
FIG. 4 shows several timing diagrams associated with the cross-coupled NAND gates of FIG. 3.

Referring to FIG. 4, while continuing to refer to FIG. 3, for example, as shown in a first scenario 40a, when a clock signal 12a is the first to arrive (as indicated by the rising edge 42a), the output 14 may generate a value of "1." The output 14 may retain (or "hold") the value of "1" even after the second clock signal 12b arrives (as shown by the rising edge 42b). Similarly, in a second scenario 40b, when a clock signal 12b is the first to arrive (as indicated by the rising edge 42b), the output 14 may generate a value of "0." The output 14 may retain (or "hold") the value of "0" even after the clock signal 12a arrives (as shown by the rising edge 42a). These results are shown in the truth table 32.

Figure 5:
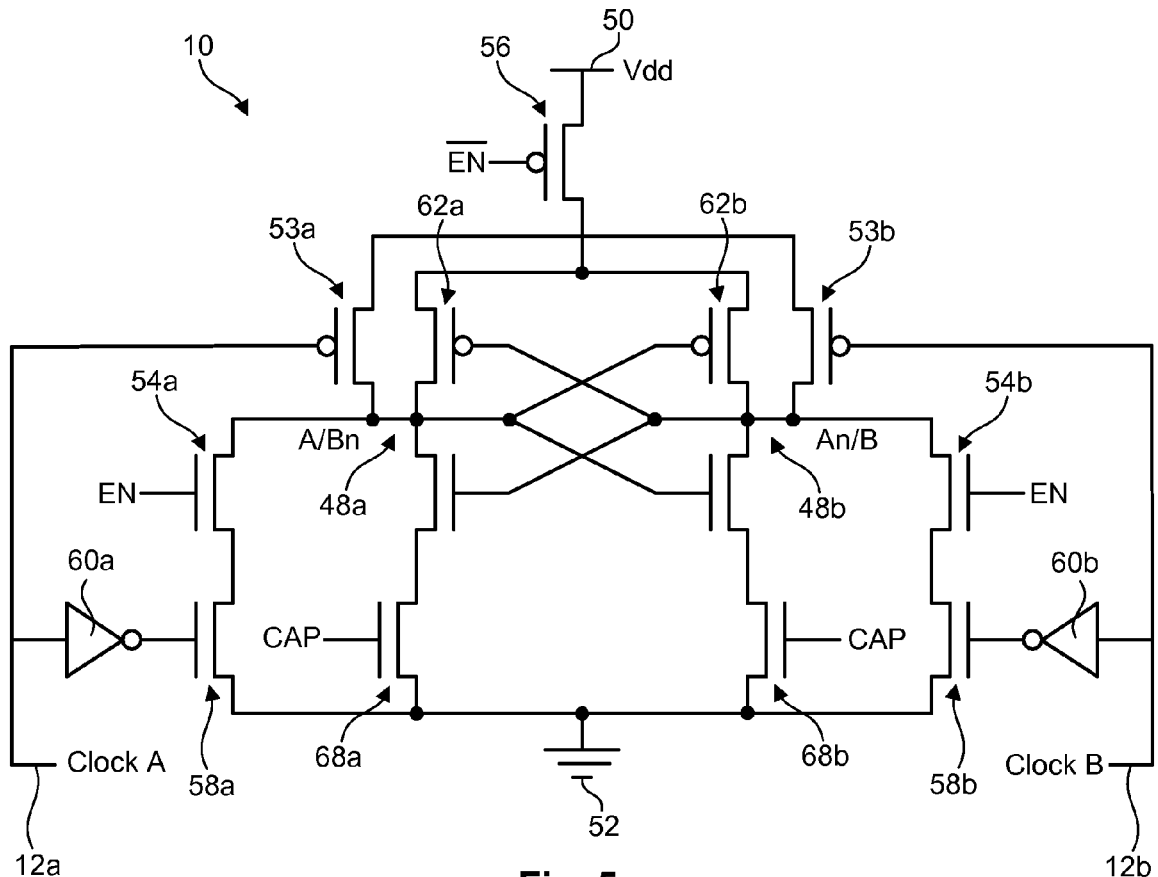
FIG. 5 shows one embodiment of a sense amplifier for use as the first clock detection circuit.

Referring to FIG. 5, while continuing to refer to FIG. 3, in selected embodiments, a first clock detection circuit 10 in accordance with the invention may provide the same functionality as the pair of cross-coupled NAND gates 30a, 30b, although it may differ in some important aspects. For example, the pair of cross-coupled NANDS 30a, 30b, as illustrated in FIG. 3, may provide an unbalanced circuit which may limit the circuit's ability to precisely detect the first arriving clock signal. This is at least partially due to the fact that the first clock signal 12a may need to propagate through both gates 30a, 30b before it affects the output 14 (because the output of the gate 30a is an input to the gate 30b), whereas the second clock signal 12b may only need to propagate through a single gate 30b before it affects the output 14. This imbalance may cause the circuit to favor one clock signal over the other, thereby impairing the circuit's ability to accurately detect the first arriving clock signal, particularly where the signals arrive in close temporal proximity. This behavior may become more problematic as clock speeds increase and greater precision is needed.

To avoid the imbalance of conventional cross-coupled NANDS, a first clock detection circuit 10 may include a sense amplifier 10 (as illustrated in FIG. 5) to detect the first of two incoming clock signals. The sense amplifier 10 may remedy the imbalance by providing two balanced nodes 48a, 48b that have a substantially equivalent voltage between a power supply voltage (Vdd) 50 and a ground voltage 52. In selected embodiments, when both clock signals 12a, 12b are low, the nodes 48a, 48b may be shorted (by turning both PFETs 53a, 53b on) to ensure that both nodes 48a, 48b have the same voltage. This ensures that the first clock detection circuit 10 starts off in a balanced condition prior to receiving the clock signals 12a, 12b.

Figure 6:
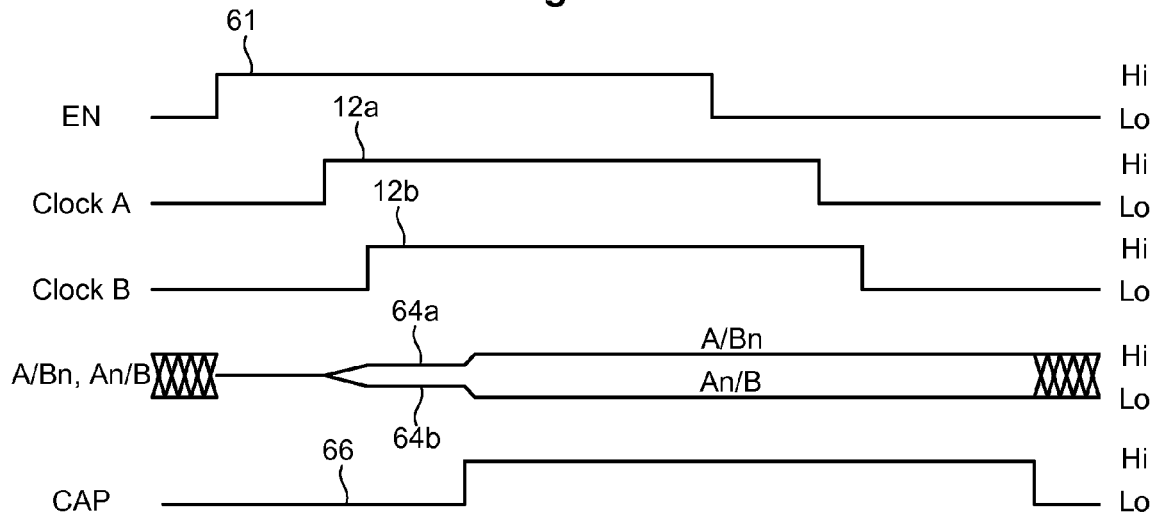
FIG. 6 is a timing diagram associated with the sense amplifier of FIG. 5.

Referring to FIG. 6, while continuing to refer to FIG. 5, shortly before the clock signals 12a, 12b arrive, an enable signal (EN) 61 may go high, which may turn on the PFET (p-channel field effect transistor) 56 and NFETS (n-channel field effect transistors) 54a, 54b. Since the clock signals 12a, 12b are still low, the NFETS 58a, 58b, driven by inverters 60a, 60b, may also be turned on. This creates a path from Vdd 50 to ground 52, splitting through the PFETS 62a, 62b and the NFET legs 54a, 58a, 54b, 58b, effectively powering up the first clock detection circuit 10. Since the PFETS 53a, 53b are still on, the voltage of the nodes 48a, 48b will be approximately Vdd/2, although the exact voltage of the nodes 48a, 48b is not important. In any case, the nodes 48a, 48b will be balanced and have the same voltage.

When a first clock signal 12a goes high, the PFET 53a will turn off, breaking the direct electrical connection between the nodes 48a, 48b and allowing their voltages to vary relative to one another. The NFET 58a will also turn off, breaking the connection between the node 48a and ground 52. This will cause the voltage of the node 48a to pull up. As the node 48a pulls up, the tying PFET 62b will begin to turn off, breaking the opposite node's connection to Vdd 50 and causing the node 48b to pull down. This will create voltage separation between the nodes 48a, 48b, as indicated by the signals 64a, 64b.

When the second clock signal 12b arrives, the NFET 58b will turn off, also disconnecting the node 48b from ground 52. This will cause the node 48b to stop pulling down. At this point, the connection between both of the nodes 48a, 48b and ground 52 is broken. Once this happens, a capture signal 66 may go high, turning on the NFETS 68a, 68b and restoring the nodes' connection to ground 52. This will allow the voltage of the nodes 48a, 48b to fully swing (as indicated by the signals 64a, 64b). The voltage of one or more of the nodes 48a, 48b may then be sampled and stored in a latch so that it can be scanned off chip. The value stored in the latch will indicate which clock signal arrived first. In certain embodiments, when sampling the nodes 48a, 48b, a buffer may be connected to both nodes 48a, 48b to maintain the balance of the circuit 10.

The above example reflects the result that would occur when a clock signal 12a arrives prior to a clock signal 12b. Obviously, the first clock detection circuit 10 (or sense amplifier 10) would behave in the opposite manner should the clock signal 12b arrive prior to the clock signal 12a. Because the circuit 10 is balanced, the circuit 10 may be resilient to PFET/NFET skew (where PFETS and NFETS differ in strength), which may be problematic in conventional cross-coupled NANDS. The circuit 10 is also more accurate because it does not favor one clock signal over the other.

Figure 7:
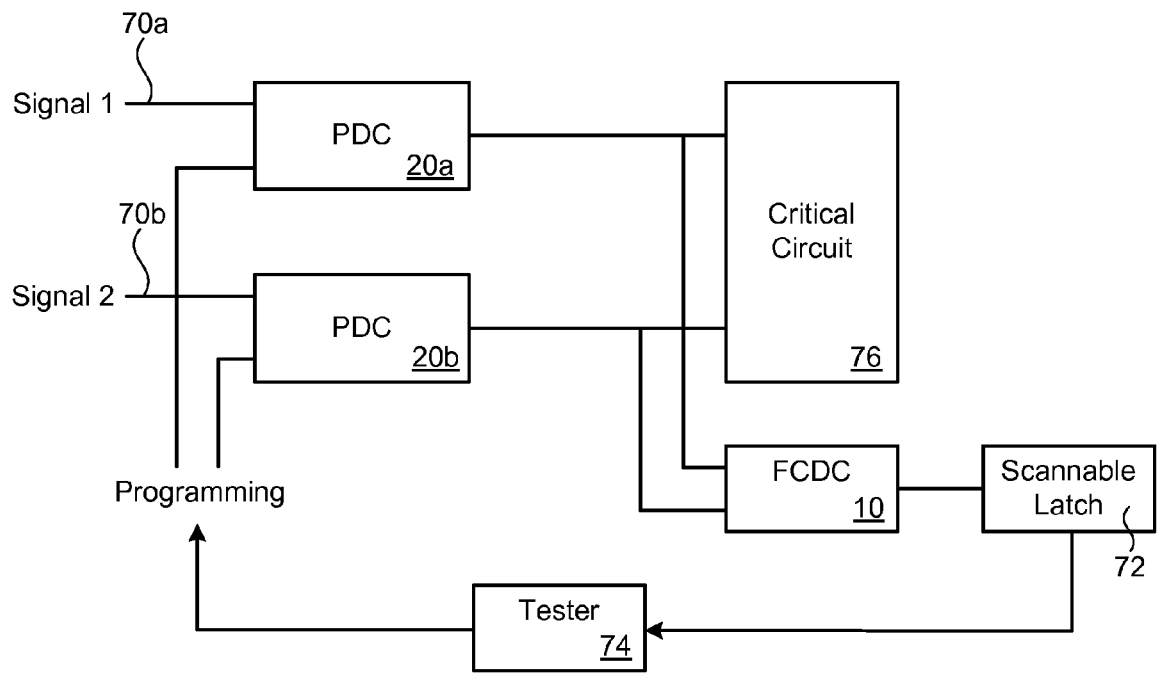
FIG. 7 is a high-level block diagram showing one configuration for reducing the skew of two signals using a first clock detection circuit and several programmable delay circuits.

Referring to FIG. 7, in selected embodiments, a first clock detection circuit 10 and several programmable delay circuits 20a, 20b may be used to adjust the signal skew of a circuit. In this example, a first clock detection circuit 10 generates a value reflecting which of two signals 70a, 70b is the first to arrive at a critical circuit 76. This value may be stored in a scannable latch 72 so that it can be scanned by a tester 74. The tester 74 may analyze the value and generate a bit pattern to adjust the delay of one or more of the programmable delay circuits 20a, 20b. In selected embodiments, the bit pattern(s) may be stored in an eFUSE, EEPROM or other memory device incorporated into an integrated circuit. The programmable delay circuits 20a, 20b may then delay one or more of the signals 70a, 70b in accordance with the bit pattern(s) to reduce the timing skew. In selected embodiments, this process (i.e., detecting the first clock signal, scanning the latch 72, changing the bit pattern, etc.) may be repeated in an iterative manner to optimally tune and reduce the timing skew.

Figure 8:
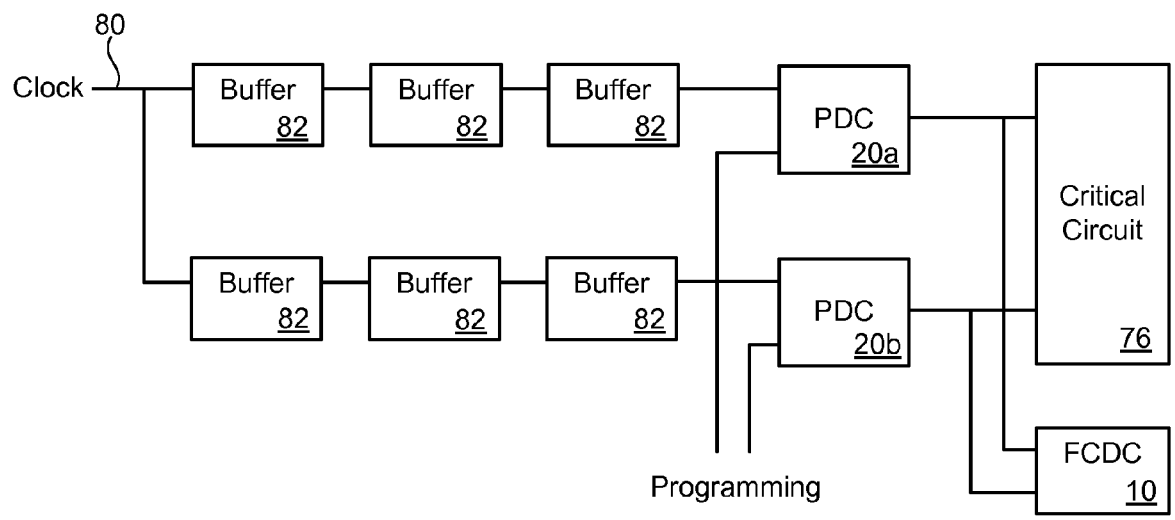
FIG. 8 is a high-level block diagram showing one configuration for reducing the skew of two clock signals using a first clock detection circuit and several programmable delay circuits.

Referring to FIG. 8, in another example in accordance with the invention, the first clock detection circuit 10 and programmable delay circuits 20a, 20b may be used to adjust the timing skew of a clock tree. In this example, an originating clock signal 80 may be split such that it travels down two different branches of a clock tree. These clock signals may pass through buffers 82 or other devices 82, each of which may impose some delay on the clock signals. In certain embodiments, the clock skew may be tuned during testing by arming the first clock detection circuit 10 and sending a single rising edge down the clock tree. The first clock detection circuit 10 may then determine which clock signal arrived first. The programmable delay circuits 20a, 20b may then be programmed to correct the skew. In selected embodiments, optimal programming of the programmable delay circuits 20a, 20b may be achieved after multiple iterations.

Figure 9:
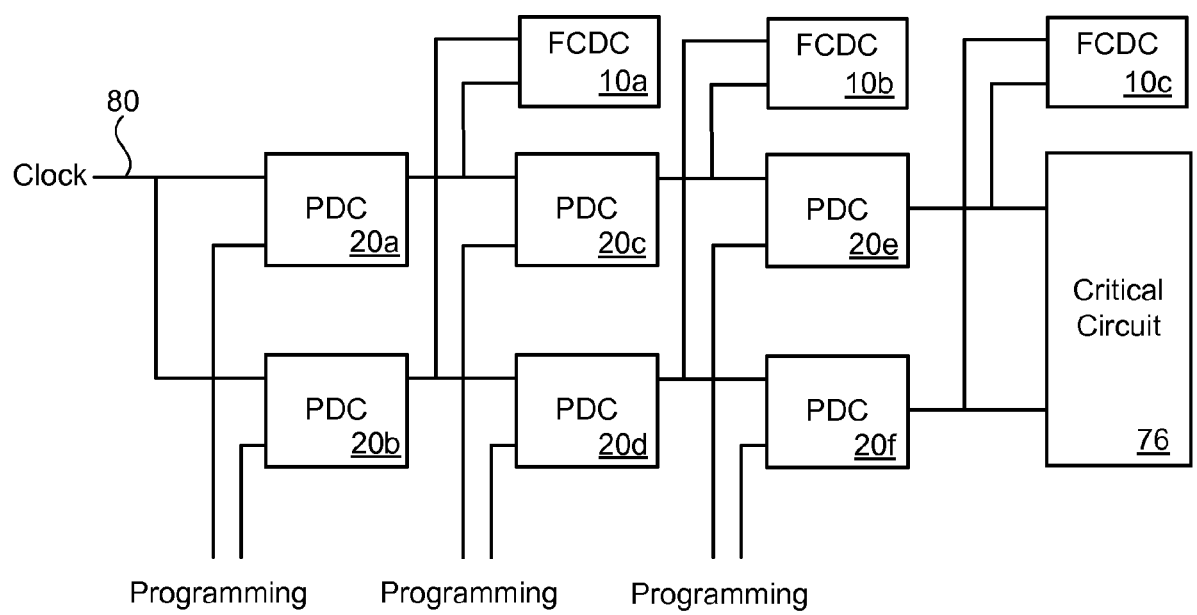
FIG. 9 is a high-level block diagram showing another configuration for reducing the skew of two clock signals using several first clock detection circuits and programmable delay circuits.

Referring to FIG. 9, in yet another example in accordance with the invention, multiple first clock detection circuits 10a-c and programmable delay circuits 20a-f may be placed at different levels of a clock tree. By detecting the skew at each level and adjusting the delays of the clock signals accordingly, the clock skew may be reduced at various levels of the clock tree.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for detecting which of first and second clock signals is the first to arrive, the method comprising:
    providing a sense amplifier comprising first and second nodes located on first and second legs of the sense amplifier, the first and second nodes having a substantially equivalent initial voltage, the initial voltage being between a power supply voltage and a ground voltage;
    receiving the first and second clock signals;
    causing the voltage of the first node to increase and the voltage of the second node to decrease in the event the first clock signal arrives before the second clock signal;
    causing the voltage of the second node to increase and the voltage of the first node to decrease in the event the second clock signal arrives before the first clock signal; and
    sampling one of the first and second nodes to determine which of the first and second clock signals was the first to arrive.

* * * * *